United States Patent [19]

Scott et al.

[11] Patent Number: 5,355,097

[45] Date of Patent: Oct. 11, 1994

[54] POTENTIOMETRIC OSCILLATOR WITH RESET AND TEST INPUT

[75] Inventors: Paul H. Scott, San Jose; Bertrand J. Williams, Campbell, both of Calif.

[73] Assignee: Cypress Semiconductor Corporation, San Jose, Calif.

[21] Appl. No.: 943,708

[22] Filed: Sep. 11, 1992

[51] Int. Cl.$^5$ .............. H03B 1/04; H03L 3/00; H03L 7/099

[52] U.S. Cl. .............. 331/1 A; 331/8; 331/34; 331/44; 331/57; 331/173; 324/500

[58] Field of Search .............. 331/1 A, 8, 34, 44, 331/57, DIG. 3, 173; 324/500

[56] References Cited

U.S. PATENT DOCUMENTS

4,771,251  9/1988  Allen et al. .............. 331/57

Primary Examiner—David Mis
Attorney, Agent, or Firm—Blakely, Sokoloff, Taylor & Zafman

[57] ABSTRACT

A phase-lock loop circuit including a voltage-controlled oscillator for generating a clock signal. The voltage-controlled oscillator includes a plurality of multiplexers coupled in series. The signal generated by the last multiplexer in the series is used as a clock signal. Each of the multiplexers in the series has a select input. Either a first signal or a second signal propagates through the series of multiplexers, depending on a select signal applied to the select inputs of the multiplexers. The second signal is the first signal with a predetermined delay. A 3-input multiplexer is connected to the first and last multiplexers in the series to the form a ring oscillator. The first or second signals output by the last multiplexer in the series is sent to an input of the 3-input multiplexer, and a test signal is sent to a third input of the 3-input multiplexer. The 3-input multiplexer also receives the select signal and a test mode signal. If the test mode signal is asserted, the 3-input multiplexer propagates the test signal to the first multiplexer in the series. If the test mode is not asserted, the 3-input multiplexer propagates either the first or the second signals based on the select signal. The phase-lock loop circuit also includes a phase frequency detection circuit for generating a phase difference signal indicative of the phase difference between the clock signal and a reference signal, a filter for generating a control signal to the voltage-controlled oscillator in response to the phase difference signal, and a feedback divider for receiving the clock signal and for feeding back a divided clock signal to the phase frequency detection circuit.

14 Claims, 7 Drawing Sheets

Figure 7

POTENTIOMETRIC OSCILLATOR WITH RESET AND TEST INPUT

BACKGROUND OF THE INVENTION

1. Field of the Invention

The present invention relates to voltage-controlled oscillators and more specifically to the voltage-controlled oscillators typically found in phase-locked loop circuits.

2. Art Background

Figure 1:
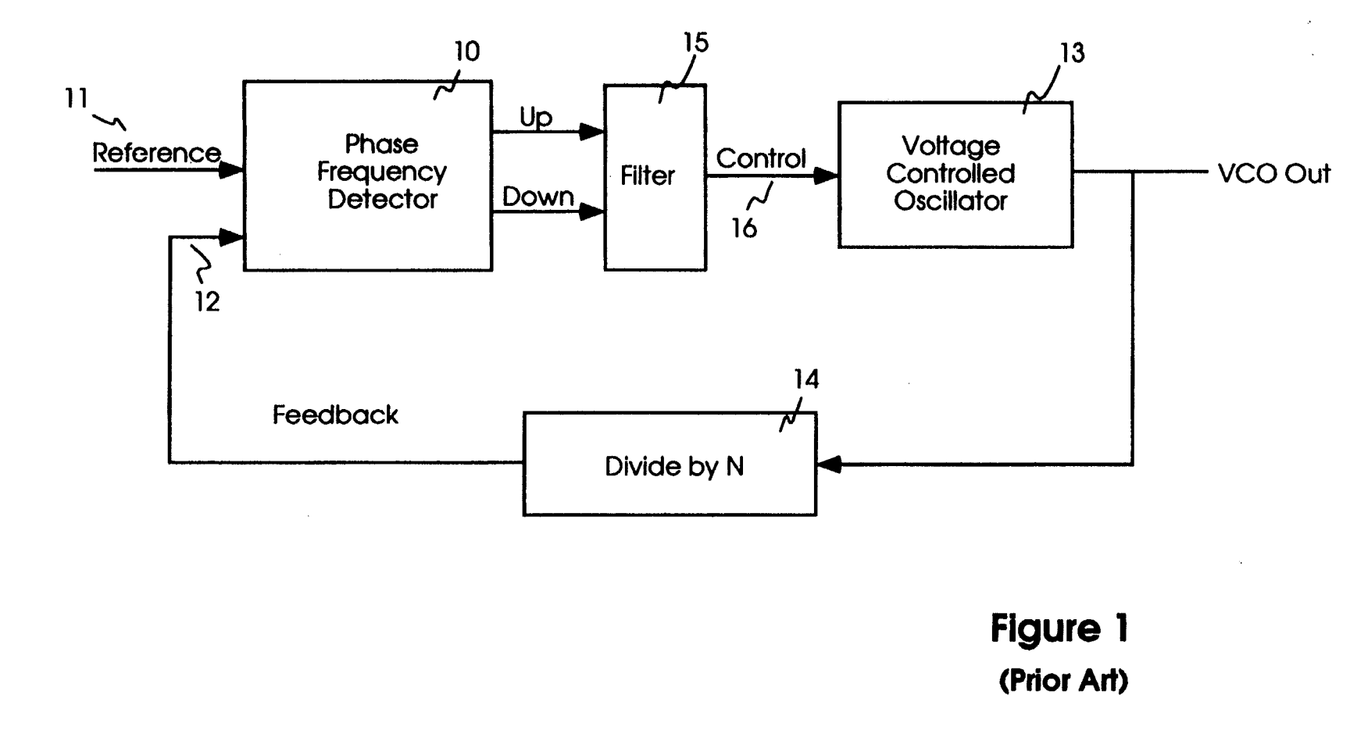
FIG. 1 illustrates a typical PLL circuit.

The functional blocks of a typical frequency multiplying phase-locked loop ("PLL") are shown in FIG. 1. Phase frequency detector 10 is a circuit that compares the frequency of reference input 11 with that of feedback input 12. The feedback frequency is the frequency of voltage controlled oscillator 13 divided by the feedback divide-by-n 14. Filter 15 converts digital phase information from phase frequency detector 10 to the analog control 16 necessary for the oscillator 13.

The frequency range of the oscillator 13 must be large enough to ensure that filter 15 can force the correct frequency from within the range of its control output 16. If the oscillator 13 were to run at too high a frequency, it may be possible that the control 16 would be unable to force it to the proper frequency. In that case the logic will run at an incorrect frequency and produce unexpected effects. It is also possible that the oscillator 13 could run faster than the feedback logic could follow. If that were to happen, feedback 12 to phase frequency detector 10 would appear slower than expected and would cause an incorrect adjustment, and the oscillator 13 would be forced to even higher frequencies.

Figure 2:
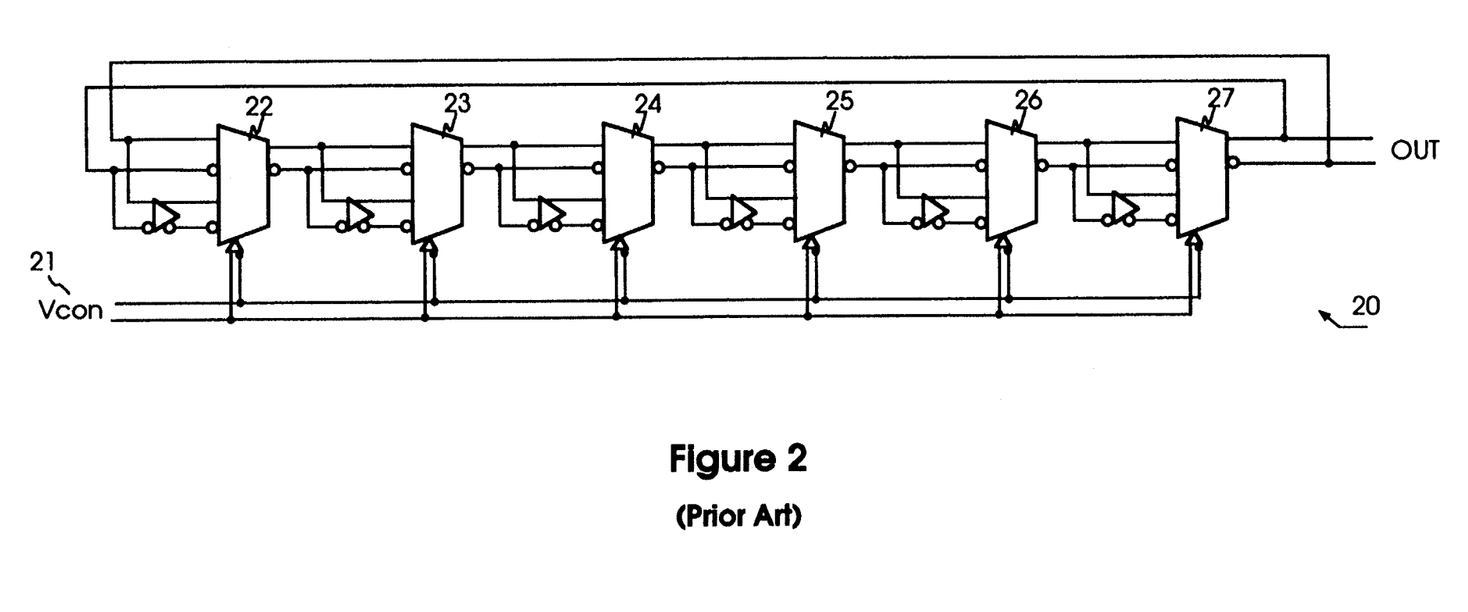
FIG. 2 illustrates a prior art VCO typically used in a PLL circuit.

FIG. 2 is a representation of a typical voltage-controlled oscillator 20 that can be used for clock generation in PLL circuits shown in FIG. 1. It is constructed of consecutive stages of gates and multiplexers. This oscillator 20 offers the convenience that it is made from logic gates identical to those used in the other logic in the chip and will react in the same way to environmental changes and to process variations. Voltage-controlled oscillator 20 ("VCO") consists of a ring oscillator that can have its effective length changed in response to a control input. As control input 21 (Vcon) is skewed from its logic "LOW" to its logic "HIGH," the oscillator 20 changes smoothly from its lowest frequency to its highest frequency. This change in frequency is achieved by the analog nature of the multiplexers 22–27 used, and their ability to "ADD" the effective delays at the two inputs as Vcon 21 is swept between the LOW and HIGH logic levels. It behaves nicely as its control limits are reached, since each limit only selects either a minimum-gate-delay or maximum-gate-delay defined frequency. Different frequency limits can be achieved by changing the number of multiplexer ("MUX")/delay stages, and/or the number of delay stages per stage.

Figure 3A:
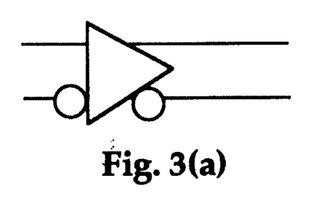
FIGS. 3(a)-(d) illustrate a differential pair and a MUX and their typical CML schematic representations.
Figure 3B:
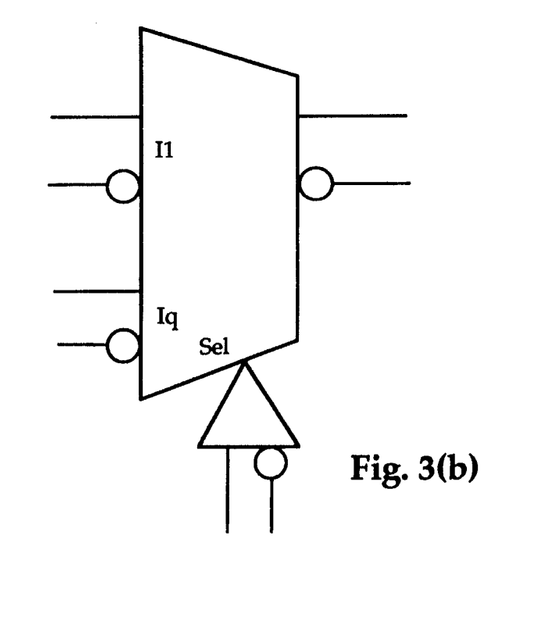
Figure 3C:
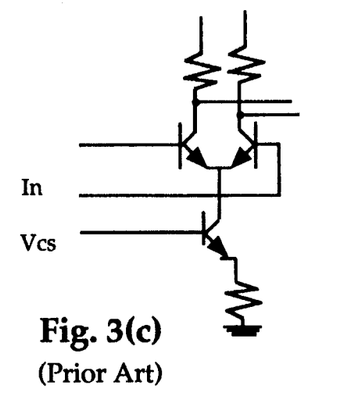
Figure 3D:
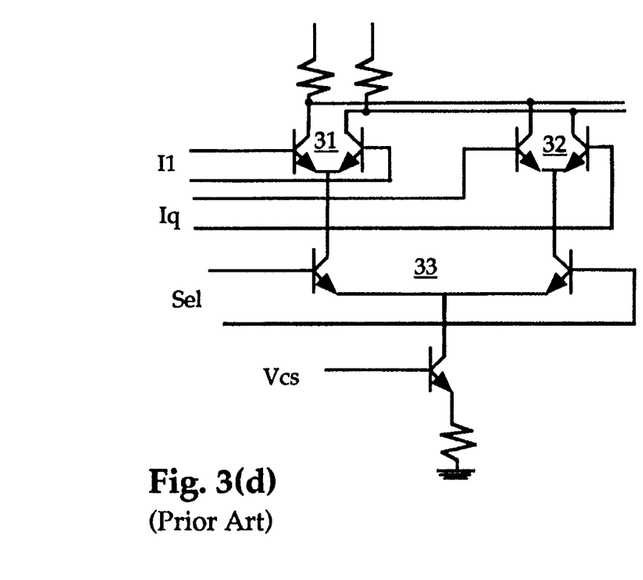

The schematic diagrams of typical PLL elements shown in FIGS. 3(a) and 3(b) are illustrated in FIGS. 3(c) and 3(d) respectively. FIGS. 3(a) and 3(c) illustrate a typical CML ("Current-Mode Logic") differential pair with Vcs as its voltage current source. FIGS. 3(b) and 3(d) illustrate a typical CML MUX using two differential pairs with a common Vcs. Complimentary input signals are applied to the bases of the differential pair 31 and 32. Complimentary select signals are applied to the common-emitter pair 33 with Vcs as its voltage current source. These circuits are typical of those used in CML circuitry as will be appreciated by those skilled in the art.

The prior circuit has its disadvantages. Since the oscillator 20 as shown in FIG. 2 is made from almost any number of successive stages of identical gates and has a cumulative delay that is much longer than the delay through a single element, it is possible that it could oscillate in more than one mode. In normal operation, a single cycle of "one to zero to one" transitions will circulate. If the gates are disturbed, or if they assume certain initial conditions as the oscillator is powered on, it is possible to get multiple cycles circulating within the ring (more than one inversion within the ring). This will cause the oscillator to appear to be running at some multiple, possibly not symmetrical, frequency with no way to recover. If this happens, the product in which this oscillator resides will appear to have failed. For short rings with 2–4 stages, it is unlikely that any alias would be possible, since the total period of oscillation is only slightly longer than the individual stage delays, and the analog adder (i.e. the MUX) would degenerate to a single mode. However, for longer rings, the MUX would find multiple transitions indistinguishable from the normal operation of the ring and would sustain them.

Furthermore, the circuit illustrated in FIG. 1 has other drawbacks. Because circuit 10 is used to create frequencies within an integrated circuit from an external reference frequency, this makes the test of the product more difficult because of the nature of the PLL circuits.

Figure 4:
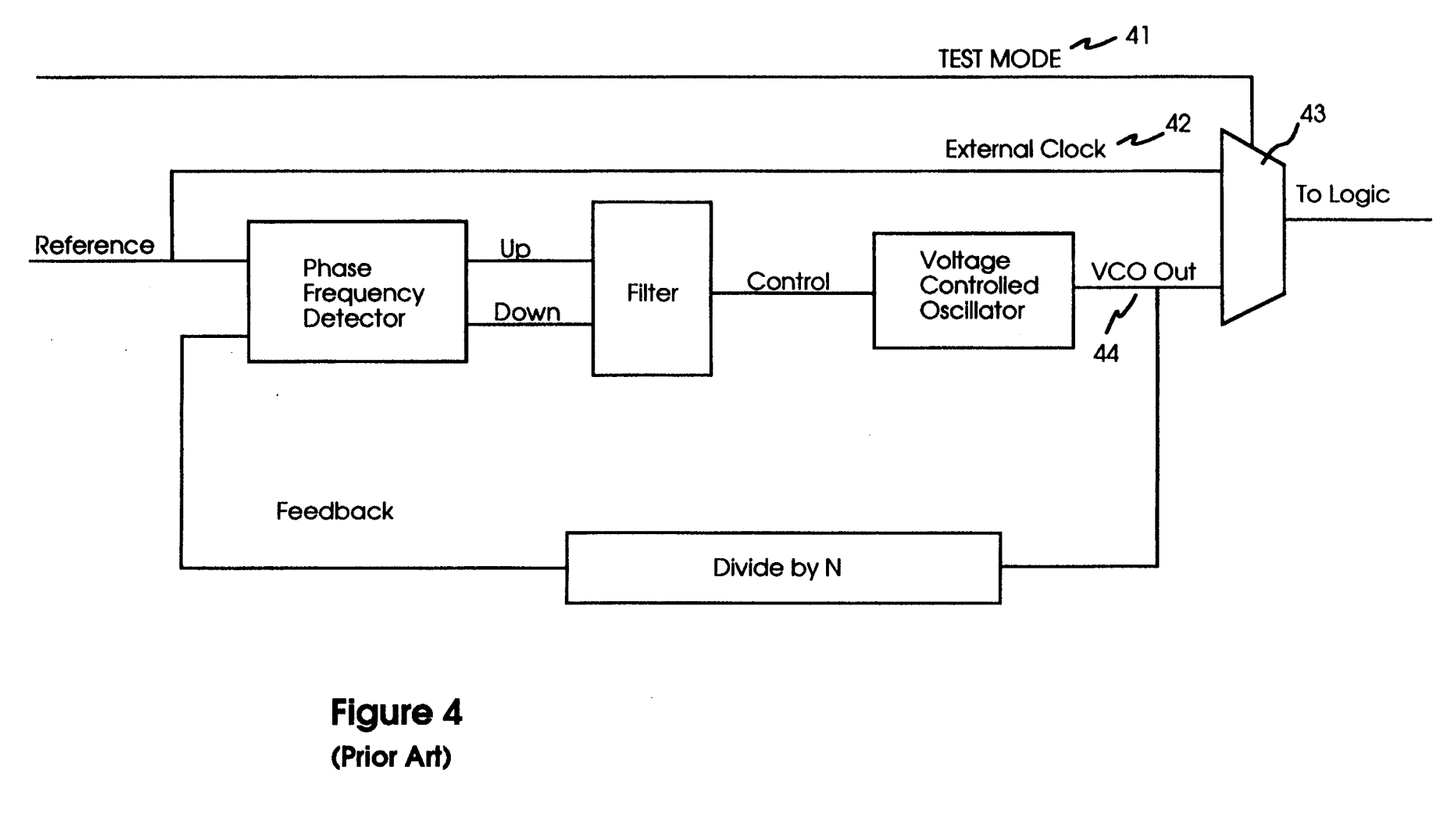
FIG. 4 illustrates a prior art PLL circuit with added testability.

In a typical circuit containing a PLL, test modes are added to facilitate factory testing. One way to add these functions is to add a MUX that will allow the user to insert an external clock in place of the internal VCO clock so that automated test Equipment (ATE) can more efficiently test the product function. A typical connection is shown in FIG. 4. Note that test mode 41 selects the inputs to MUX 43, which receives inputs from external clock 42 and VCO output 44.

Although the traditional technique shown in FIG. 4 allows efficient test of the product's function, it leaves the PLL and all of its components untested. As a result, further testing is required to verify both function and parametric values for the PLL.

As will be described in the following, the present invention provides an apparatus for initializing the VCO of a PLL circuit to ensure that it runs at the intended frequency. Also, the present invention provides a method and apparatus for adding increased testability to circuits containing the PLL.

SUMMARY OF THE INVENTION

According to one aspect of the present invention, a voltage-controlled oscillator for generating a clock signal is provided. The voltage-controlled oscillator includes a plurality of multiplexers coupled in series. The plurality of multiplexers includes a first multiplexer and a last multiplexer. Each of the plurality of multiplexers has signal inputs, a select input, and signal output. The signal input of each of the plurality of multiplexers except the first multiplexer is electrically coupled with the signal output of a previous multiplexer of the plurality of multiplexers for receiving a first and second input signal from the previous multiplexer. The second input signal is the first input signal with a predetermined delay. The signal output of each of the plurality of multiplexers except the last multiplexer is electrically coupled with the input signal of a next multiplexer of the plurality of multiplexers for propagating one of the first and second input signals to the next multiplexer in response to a select signal applied at the select input. The last multiplexer generates the one of the first and second input signals as an output signal in response to the select signal applied at its select input.

The voltage-controlled oscillator further includes test means for generating a test signal of predetermined logic level and a 3-input multiplexer. The 3-input multiplexer has first, second and third signal inputs, a select input, and signal output. The first and second signal input of the 3-input multiplexer is electrically coupled with the signal output of the last multiplexer for receiving the output signal. The signal output of the 3-input multiplexer is electrically coupled with the signal input of the first multiplexer, wherein the plurality of multiplexers and the 3-input multiplexer form a ring oscillator. The 3-input multiplexer receives the first and second input signals at the first and second signal inputs of the 3-input multiplexer from the last stage of the plurality of multiplexers and receives the test signal as a third input signal at the third signal input of the 3-input multiplexer. The 3-input multiplexer propagates one of the first, second and third input signals to the first multiplexer.

The voltage-controlled oscillator further includes a selecting circuit electrically coupled with the select input of each of the plurality of multiplexers and the select input of the 3-input multiplexer for generating the select signal to select one of the first and second input signals. The selected input signal is propagated through the ring oscillator.

Further, the voltage-controlled oscillator includes an initiator coupled with the 3-input multiplexer for generating an initiate signal to select the test signal to be generated at the signal output of the 3-input multiplexer. The initiate signal overrides the select signal such that the test signal propagates through the ring oscillator with the predetermined level.

According to another aspect of the present invention, a phase-lock loop circuit is provided. The phase-lock loop circuit generates a clock signal in response to a reference signal. The phase-lock loop circuit includes a phase frequency detector for determining the phase difference between the clock signal and the reference signal. The phase frequency detector generates a phase difference signal indicative of the phase difference.

The phase-lock loop circuit further includes a filter electrically coupled to the phase frequency detector for receiving the phase difference signal and for generating a control signal in response to the phase difference signal. The phase-lock loop circuit also includes a feedback divider coupled to the phase detection means for feeding back a divided clock signal from the clock signal to the phase detector.

Finally, the phase-lock loop circuit includes a voltage-controlled oscillator as described above. The voltage-controlled oscillator is electrically coupled with the filter for receiving the control signal and for generating the clock signal at a frequency responsive to the control signal. The voltage-controlled oscillator is electrically coupled with the feedback divider for transmitting the clock signal to the feedback divider.

According to yet another aspect of the invention, a phase-lock loop circuit with a test mode for generating a clock signal in response to a reference signal is provided. The test mode causes the components of the phase-lock loop circuit to be tested. The phase-lock loop circuit includes phase frequency detector for receiving the reference signal and for determining the phase difference between the clock signal and the reference signal. The phase frequency detector generates a phase difference signal indicative of the phase difference.

The phase-lock loop circuit further includes a filter and a feedback divider. The filter is coupled to the phase frequency detector for receiving the phase difference signal and for generating a control signal in response to the phase difference signal. The feedback divider is coupled to the phase detector for feeding back a divided clock signal from the clock signal to the phase detector. The phase-lock loop circuit also includes a test mode selecting circuit for providing a test mode signal for testing the phase-lock loop circuit, and a voltage-controlled oscillator.

The voltage-controlled oscillator is electrically coupled with the filter for receiving the control signal and for generating the clock signal at a frequency responsive to the control signal. The voltage-controlled oscillator is electrically connected with the feedback divider for transmitting the clock signal to the feedback divider. The voltage-controlled oscillator includes a plurality of multiplexers, a 3-input multiplexer, a selecting circuit and a test mode selecting circuit.

The test mode selecting circuit is coupled to the 3-input multiplexer for receiving the test mode signal to select the reference signal for generation at the signal output means of the 3-input multiplexer. The test mode signal overrides the select signal such that the reference signal propagates through the ring oscillator.

BRIEF DESCRIPTION OF THE DRAWINGS

The objects, features and advantages of the present invention will become apparent to one skilled in the art from reading the following detailed description in which:

FIGS. 6(a) and (b) illustrate a 3-input MUX and its schematic diagram respectively.

DETAILED DESCRIPTION OF THE INVENTION

In the following description, numerous specific details are set forth in order to provide a thorough understanding of the present invention. It will be obvious, however, to one skilled in the art that these details are not required to practice the present invention. In other instances, well-known circuits, methods and the like are not set forth in detail in order to avoid unnecessarily obscuring the present invention.

Figure 5:
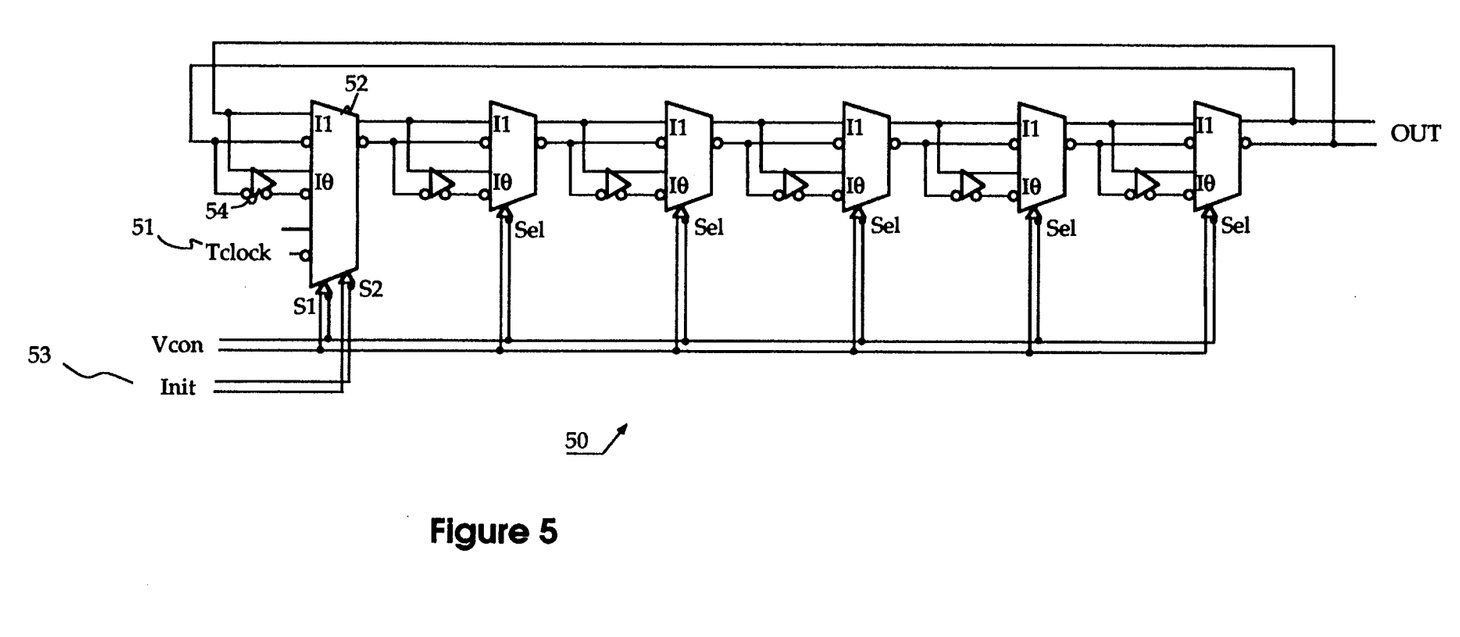
FIG. 5 is a functional diagram of the VCO according to the present invention.

As will be appreciated by those skilled in the art, if one of the two-input MUX stages used in the oscillator described above is replaced with a three-input MUX 52 as shown in FIG. 5, it becomes possible to clear, or prevent the problem of multiple modes of oscillation described above. The third data input (Tclock 51) can be selected during power up and assuming that Tclock 51 is either "HIGH" or "LOW", a known logic level will be propagated throughout the oscillator 50, thus eliminating the multiple modes which could have been present. It should be possible to make this selection automatically, and as a function of the power-on sequence. Because of the number of transistor levels in the three input MUX 52, it will be the last logic block in the oscillator 50 to achieve normal operation as the power supply is ramped to normal voltage. This attribute alone might be enough to assure correct operation of the oscillator 50, but an explicit selection of an INIT input 53 will guarantee correct operation. The CML schematic representation of a three-input MUX is illustrated in FIGS. 6(a) and 6(b).

Figure 6:
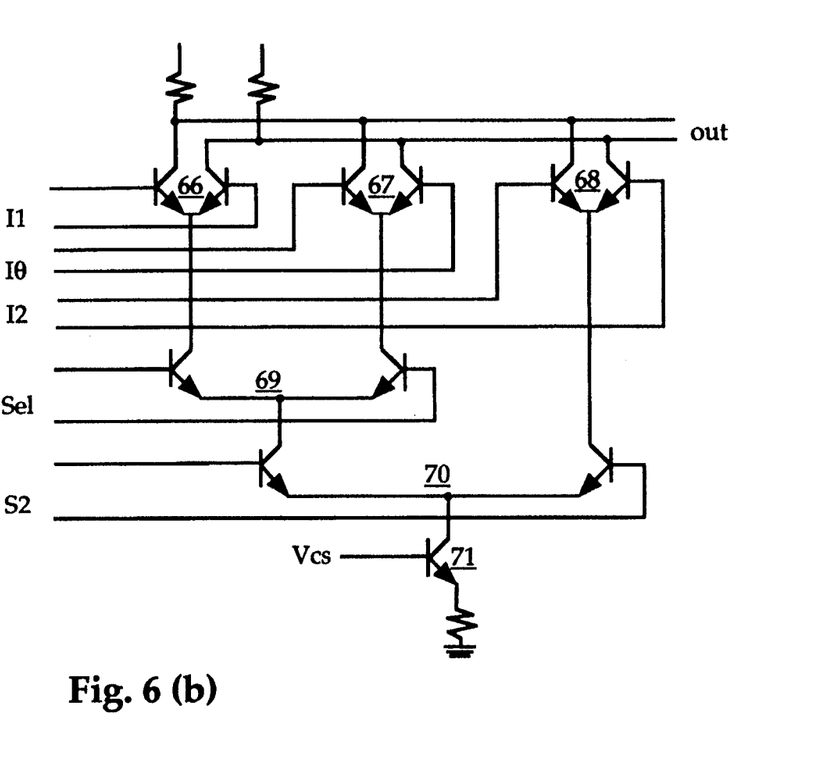
Figure 6A:
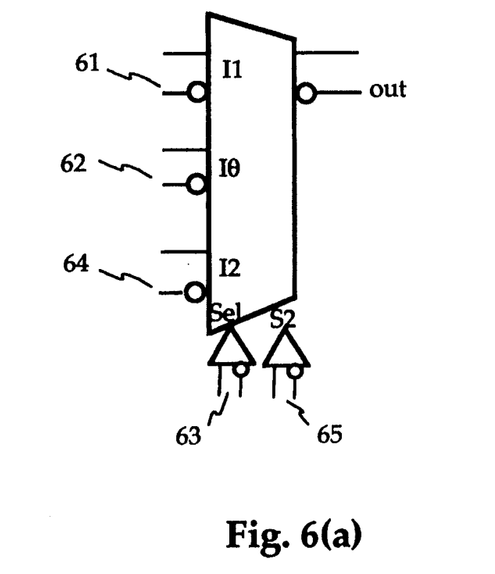

Referring to FIGS. 6(a) and 6(b), the upper two inputs (I0 and I1) 61 and 62 perform the same function as those inputs on a two-input MUX, where they propagate the oscillator signal under control of the SELECT input (Sel) 63. The third input (I2) 64 is selected by the second select input (S2) 65 and will override the signals present at (I0 and I1) 61 and 62. (This is the normal function of this type of logical multiplexer.)

As shown in FIG. 6(b), complementary input signals I1 are applied to the bases of differential pair 66. Complimentary input signals I0 are applied to the bases of differential pair 67. Complimentary input signals I2 are applied to the bases of differential pair 68. Complimentary Sel signals are applied to the bases of differential pair 69 with its collectors coupled to the emitters from the differential pair 66 and 67. Complimentary S2 signals are applied to the bases of differential pair 70 with its collectors coupled to the connected emitters from differential pairs 69 and 68. The connected emitters of differential pair 70 are coupled to the collector of transistor 71, whose base is coupled to a voltage current source. Complimentary output signals appear at the respective connected collectors of differential pairs 66, 67 and 69.

This oscillator has a facility to clear the erroneous multiple modes possible with the earlier versions. Furthermore, as will be appreciated by those skilled in the art, the three-input MUX might be changed to a "Power-On" circuit if test mode were not an issue.

Furthermore, if the oscillator in the PLL block described above is replaced by a "Potentiometric-Oscillator-With-Reset-and-Test-Inputs" (POWRTI), then the test function can be expanded to include all of the PLL blocks as shown in VCO 50 in FIG. 5. This oscillator 50 might be used to eliminate unwanted alias frequency modes. If the INIT line (S2) 52 and the third data input (Tclock) 51 are brought out to external logic, an increased test function becomes possible without additional logic beyond that already included in the oscillator for other reasons. When INIT 53 is connected to the TEST MODE enable logic (41, FIG. 4) and TCLOCK 51 is connected to the external pin used to input the test mode bit clock (42, FIG. 4), most of the gates inside the oscillator 50 (all but the inverter 54 will be implicitly tested during the course of normal functional testing.

Referring to FIG. 5, the upper two inputs I0 61 and 62 of MUX 52 perform the same function as those inputs on the two input MUX. They propagate the oscillator signal under control of the SELECT (63, FIGS. 6(a) and (b) input (SeL). The third DATA input (I2) (64, FIGS. 6(a) and 6(b)) is selected by the input (S2) and will override the signals present at (I0 and I1) 61 and 62.

Figure 7:
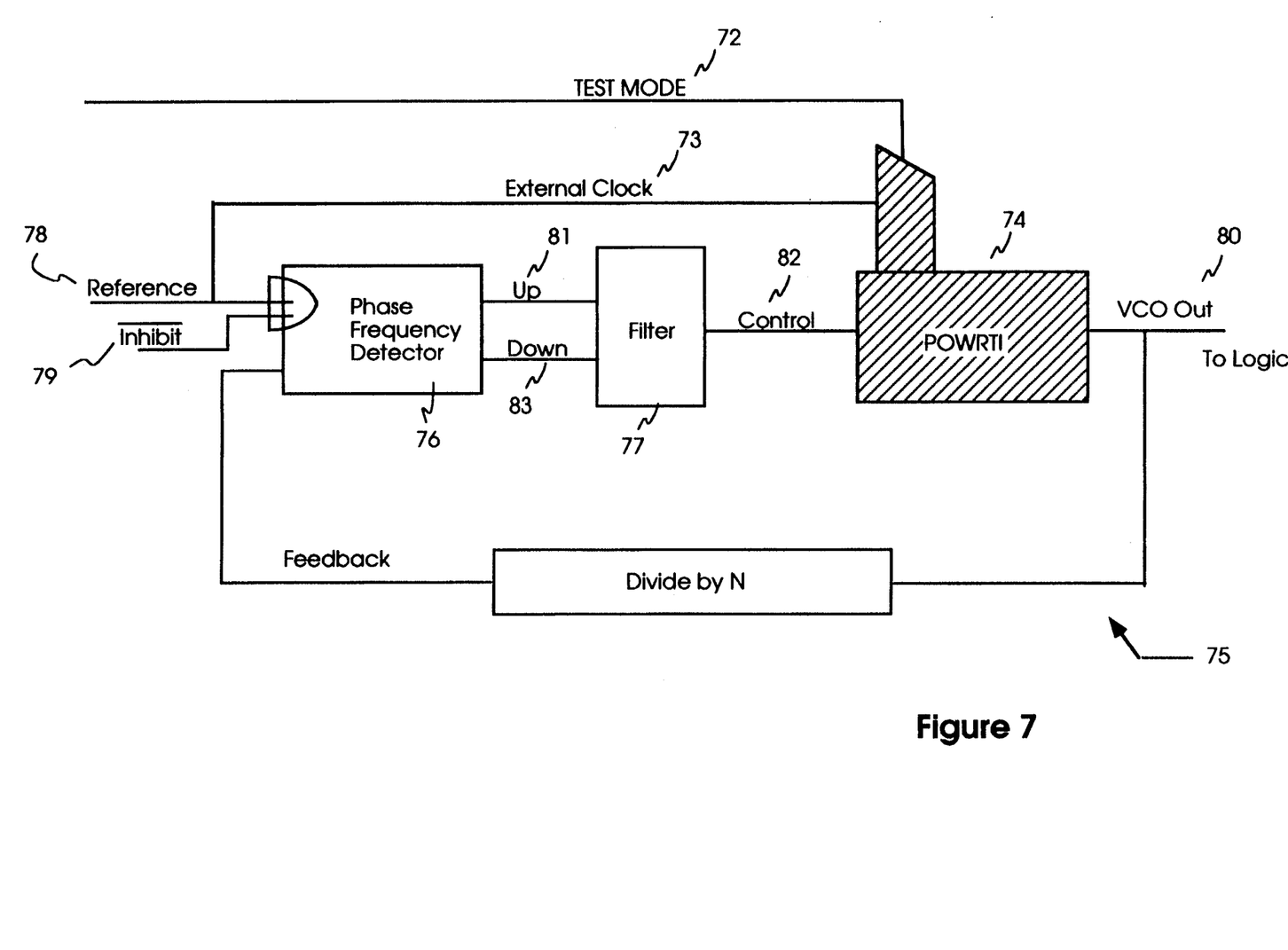
FIG. 7 is a functional diagram of the phase-lock loop with added testability.

The functions of the circuit according to FIG. 5 can be used to increase the testability of the functional components used to implement the PLL function while in TEST MODE, without increased complexity beyond that necessary to ensure correct function of the oscillator. A circuit 75 according to the teaching of the present invention is shown in FIG. 7, where VCO 74 becomes part of the TEST MODE 72 clock path, and is implicitly tested by any TEST MODE function.

Phase detector 76 and filter 77 can be tested by monitoring the delay through VCO 74 when it is manifested as propagation delay from the Test Mode input clock 73 to some dependent logical output. When the REFERENCE input 78 is used as the "bit clock" the phase frequency detector 76 will normally, if Inhibit 79 is not asserted, indicate that VCO 74 is running too slowly (since VCO OUT 80 divided by ten is much slower than REFERENCE 78) by asserting its "UP" 81 output. FILTER 77 should cause the CONTROL input 82 to VCO 74 to rise and select the shortest path through all of the delay stages in the oscillator. If the Inhibit input 79 is asserted, the REFERENCE input 78 to the phase Detector 76 will be removed making it seem as if VCO 74 were running too fast (since there are no transitions compared to any number of transitions of the VCO/10 feedback), which will be indicated by an assertion of the "DOWN" input 83. Filter 77 should cause the CONTROL input 82 to VCO 74 to fall and select the longest path through all of the delay stages in the oscillator 74. A simple propagation delay comparison during some portion of the test sequence will assure that all of the blocks in the PLL are functioning. (i.e., the phase detector 76 can "detect frequency;" the filter 77 can correctly interpret "UP and DOWN" and assert the control output 82; the POWRTI oscillator 74 can be controlled and all its internal gates are within specified delay tolerance.)

This oscillator and the illustrated connections simplify TEST MODE logic and allow increased test of PLL functionally without complex ATE initialization.

The foregoing description of the invention has been presented for the purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

We claim:

1. A voltage-controlled oscillator for generating a clock signal, said voltage-controlled oscillator comprising:

a plurality of multiplexers coupled in series, said plurality of multiplexers including a first multiplexer and a last multiplexer, each of said plurality of multiplexers having a signal input, a select input, and a signal output, said signal input of each of said plurality of multiplexers except said first multiplexer being electrically coupled with said signal output of a previous multiplexer of said plurality of multiplexers for receiving one of a first and second input signal from said previous multiplexer, said second input signal being said first input signal with a predetermined delay, said signal output of each of said plurality of multiplexers except said last multiplexer being electrically coupled with said signal input of a next multiplexer of said plurality of multiplexers for propagating one of said first and second input signals to said next multiplexer in response to a select signal applied at said select input, said last multiplexer generating said one of said first and second input signals as an output signal in response to said select signal applied at its select input:

a test circuit for generating a test signal of predetermined logic level;

a 3-input multiplexer having first, second and third signal inputs, a select input, and a signal output, said first and second signal input of said 3-input multiplexer being electrically coupled with said signal output of said last multiplexer for receiving said output signal, said signal output of said 3-input multiplexer being electrically coupled with said signal input of said first multiplexer, wherein said plurality of multiplexers and said 3-input multiplexer form a ring oscillator, said 3-input multiplexer receiving said first and second input signals at said first and second signal inputs of said 3-input multiplexer from said last multiplexer of said plurality of multiplexers and receiving said test signal as a third input signal at said third signal input, said 3-input multiplexer propagating one of said first, second and third input signals to said first multiplexer of said plurality of multiplexers;

a selecting circuit electrically coupled with said select input of each of said plurality of multiplexers and said select input of said 3-input multiplexer for generating said select signal to select one of said first and second input signals, said selected input signal being propagated through said ring oscillator; and a initiator electrically coupled with said 3-input multiplexer for generating an initiate signal to select said test signal to be generated at said signal output of said 3-input multiplexer, said initiate signal overriding said select signal such that said test signal propagates through said ring oscillator with said predetermined logic level.

2. A voltage-controlled oscillator according to claim 1, wherein said plurality of multiplexers and said 3-input multiplexer are constructed in current-mode logic ("CML") circuits such that each of said first input signal, said second input signal, and said select signal is accompanied by its complement signal.

3. A voltage-controlled oscillator according to claim 2, wherein said 3-input multiplexer comprises:

first pair of emitter-coupled transistors of first conductive type for receiving said first input signal and its complement signal at its bases;

second pair of emitter-coupled transistors of said first conductive type for receiving said second input signal and its complement signals at its bases;

third pair of emitter-coupled transistors of said first conductive type electrically coupled with said first and second pairs, a first collector of said third pair being electrically coupled with the coupled emitters of said first pair and a second collector of said third pair being electrically coupled with the coupled emitters of said second pair, the bases of said third pair receiving said select signal and its complement signal for selecting for output a selected signal and its complement, said selected signal and its complement being one of said first input signal and its complement from said first pair and said second input signal and its complement from said second pair, only when said initiate signal is not active;

fourth pair of emitter-coupled transistors of said first conductive type for receiving said test signal and its complement signal at its bases;

fifth pair of emitter-coupled transistors of said first conductive type electrically coupled with said third and fourth pairs, a first collector of said fifth pair being electrically coupled with the coupled emitters of said third pair and a second collector of said fifth pair being electrically coupled with the coupled emitters of said fourth pair, the bases of said fifth pair receiving said initiate signal and its complement signal for selecting for output one of said selected signal and its complement from said third pair and said test signal and its complement from said fourth pair, said initiate signal overriding said select signal; and current source transistor of said first conductive type having its collector electrically coupled with the emitters of said fifth pair at the collector.

4. A voltage-controlled oscillator according to claim 3, wherein said first conductive type is an n-p-n transistor.

5. A voltage-controlled oscillator according to claim 4, wherein said initiator selects said test signal automatically during power-on.

6. A phase-lock loop circuit for generating a clock signal in response to a reference signal, said phase-lock loop circuit comprising:

phase frequency detector for determining a phase difference between said clock signal and said reference signal, said phase frequency detector generating a phase difference signal indicative of said phase difference;

a filter electrically coupled to said phase frequency detector for receiving said phase difference signal and for generating a control signal in response to said phase difference signal;

a feedback divider electrically coupled to said phase frequency detector for feeding back a divided clock signal from said clock signal to said phase frequency detector;

voltage-controlled oscillator electrically coupled with said filter for receiving said control signal and for generating said clock signal at a frequency responsive to said control signal, said voltage-controlled oscillator being electrically coupled with said feedback divider for transmitting said clock signal to said feedback divider, said voltage-controlled oscillator comprising:

a plurality of multiplexers coupled in series, said plurality of multiplexers including a first multiplexer and a last multiplexer, each of said plurality of multiplexers having a signal input, a select input, and a signal output, said signal input of each of said plurality of multiplexers except said first multiplexer being electrically coupled with said signal output of a previous multiplexer of said plurality of multiplexers for receiving one of a first and second input signal from said previous multiplexer, said second input signal being said first input signal with a predetermined delay, said signal output of each of said plurality of multiplexers except said last multiplexer being electrically coupled with said signal input of a next multiplexer of said plurality of multiplexers for propagating one of said first and second input signals to said next multiplexer in response to a select signal applied at said select input, said last multiplexer generating said one of said first and second input signals as an output signal in response to said select signal applied at its select input;

a test circuit for generating a test signal of predetermined logic level;

a 3-input multiplexer having first, second and third signal inputs, a select input, and a signal output, said first and second signal input of said 3-input multiplexer being electrically coupled with said signal output of said last multiplexer for receiving said output signal, said signal output of said 3-input multiplexer being electrically coupled with said signal input of said first multiplexer, wherein said plurality of multiplexers and said 3-input multiplexer form a ring oscillator, said 3-input multiplexer receiving said first and second input signals at said first and second signal inputs of said 3-input multiplexer from said last multiplexer of said plurality of multiplexers and receiving said test signal as a third input signal at said third signal input, said 3-input multiplexer propagating one of said first, second and third input to said first multiplexer of said plurality of multiplexers;

a selecting circuit electrically coupled with said select input of each of said plurality of multiplexers and said select input of said 3-input multiplexer for generating said select signal to select one of said first and second input signals, said selected input signal being propagated through said ring oscillator; and an initiator electrically coupled with said 3-input multiplexer for generating an initiate signal to select said test signal to be generated at said signal output of said 3-input multiplexer, said initiate signal overriding said select signal such that said test signal propagates through said ring oscillator with said predetermined logic level.

7. A phase-lock loop circuit according to claim 6, wherein said plurality of multiplexers and said 3-input multiplexer are constructed in current-mode logic ("CML") circuits such that each of said first input signal, said second input signal and said select signal is accompanied by its complement signal.

8. A phase-lock loop circuit according to claim 7, wherein said 3-input multiplexer comprises:

first pair of emitter-coupled transistors of first conductive type for receiving said first input signal and its complement signal at its bases;

second pair of emitter-coupled transistors of said first conductive type for receiving said second input signal and its complement signals at its bases;

third pair of emitter-coupled transistors of said first conductive type electrically coupled with said first and second pairs, a first collector of said third pair being electrically coupled with the coupled emitters of said first pair and a second collector of said third pair being electrically coupled with the coupled emitters of said second pair, the bases of said third pair receiving said select signal and its complement signal for selecting for output a selected signal and its complement, said selected signal and its complement being one of said first input signal and its complement from said first pair and said second input signal and its complement from said second pair, only when said initiate signal is not active;

fourth pair of emitter-coupled transistors of said first conductive type for receiving said test signal and its complement signal at its bases;

fifth pair of emitter-coupled transistors of said first conductive type electrically coupled with said third and fourth pairs, a first collector of said fifth pair being electrically coupled with the coupled emitters of said third pair and a second collector of said fifth pair being electrically coupled with the coupled emitters of said fourth pair, the bases of said fifth pair receiving said initiate signal and its complement signal for selecting for output one of said selected signal and its complement from said third pair and said test signal and its complement from said fourth pair, said initiate signal overriding said select signal; and current source transistor of said first conductive type having its collector electrically coupled with the emitters of said fifth pair at the collector.

9. A phase-lock loop circuit according to claim 8, wherein said first conductive type is an n-p-n transistor.

10. A phase-lock loop circuit according to claim 9, wherein said initiator generates said initiated signal automatically during power-on said phase-lock loop circuit.

11. A phase-lock loop circuit with a test mode for generating a clock signal in response to a reference signal, said test mode causing the components of said phase-lock loop circuit to be tested, said phase-lock loop circuit comprising:

phase frequency detector for receiving said reference signal and for determining a phase difference between said clock signal and said reference signal, said phase frequency detector generating a phase difference signal indicative of said phase difference;

a filter electrically coupled to said phase frequency detector for receiving said phase difference signal and for generating a control signal in response to said phase difference signal;

a feedback divider electrically coupled to said phase frequency detector for feeding back a divided clock signal from said clock signal to said phase frequency detector;

voltage-controlled oscillator electrically coupled with said filter for receiving said control signal and for generating said clock signal at a frequency responsive to said control signal, said voltage-controlled oscillator being electrically coupled with said feedback divider for transmitting said clock signal to said feedback divider, said voltage-controlled oscillator comprising:

a plurality of multiplexers coupled in series, said plurality of multiplexers including a first multiplexer and a last multiplexer, each of said plurality of multiplexers having a signal input, a select input, and a signal output, said signal input of each of said plurality of multiplexers except said first multiplexer being electrically coupled with said signal output of a previous multiplexer of said plurality of multiplexers for receiving one of a first and second input signal from said previous multiplexer, said second input signal being said first input signal with a predetermined delay, said signal output of each of said plurality of multiplexers except said last multiplexer being electrically coupled with said signal input of a next multiplexer of said plurality of multiplexers for propagating one of said first and second input signals to said next multiplexer in response to a select signal applied at said select input, said last multiplexer generating said one of said first and second input signals as an output signal in response to said select signal applied at its select input;

a 3-input multiplexer having first, second and third signal inputs, a select input, and signal output, said first and second signal input of said 3-input multiplexer being electrically coupled with said signal output of said last multiplexer for receiving said output signal, said signal output of said 3-input multiplexer being electrically connected with said signal input of said first multiplexer, wherein said plurality of multiplexers and said 3-input multiplexer form a ring oscillator, said 3-input multiplexer receiving said first and second input signals at said first and second signal inputs of said 3-input multiplexer from said last multiplexer of said plurality of multiplexers and receiving said reference signal as a third input signal at said third signal input, said 3-input multiplexer propagating one of said first, second and third input signals to said first multiplexer of said plurality of multiplexers;

a selecting circuit electrically coupled with said select input of each of said plurality of multiplexers and said select input of said 3-input multiplexer for generating said select signal to select one of said first and second input signals, said selected input signal being propagated through said ring oscillator; and a test mode selecting circuit coupled to said 3-input multiplexer for receiving a test mode signal to select said reference signal for generation at said signal output of said 3-input multiplexer, said test mode signal overriding said select signal such that said reference signal propagates through said ring oscillator.

12. A phase-lock loop circuit with a test mode according to claim 11, further comprising inhibit means electrically connected with said phase frequency detector for inhibiting reception of said reference signal by said phase frequency detector to cause said voltage-controlled oscillator to slow down.

13. A phase-lock loop circuit according to claim 12, wherein said 3-input multiplexer comprises:

first pair of emitter-coupled transistors of first conductive type for receiving said first input signal and its complement signal at its bases;

second pair of emitter-coupled transistors of said first conductive type for receiving said second input signal and its complement signals at its bases;

third pair of emitter-coupled transistors of said first conductive type electrically coupled with said first and second pairs, a first collector of said third pair being electrically coupled with the coupled emitters of said first pair and a second collector of said third pair being electrically coupled with the coupled emitters of said second pair, the bases of said third pair receiving said select signal and its complement signal for selecting for output a selected signal and its complement, said selected signal and its complement being one of said first input signal and its complement from said first pair and said second input signal and its complement from said second pair, only when said test mode signal is not active;

fourth pair of emitter-coupled transistors of said first conductive type for receiving said reference signal and its complement signal at its bases;

fifth pair of emitter-coupled transistors of said first conductive type electrically coupled with said third and fourth pairs, a first collector of said fifth pair being electrically coupled with the coupled emitters of said third pair and a second collector of said fifth pair being electrically coupled with the coupled emitters of said fourth pair, the bases of said fifth pair receiving said test mode signal and its complement signal for selecting for output said reference signal and its complement from said fourth pair, said test mode signal overriding said select signal; and current source transistor having its collector electrically coupled with the emitters of said fifth pair at the collector.

14. A phase-lock loop circuit according to claim 13, wherein said first conductive type is an n-p-n conduction.

* * * * *